(12) United States Patent
Fischer et al.

(10) Patent No.: US 11,588,231 B2
(45) Date of Patent: Feb. 21, 2023

(54) RADAR SENSOR INCLUDING WAVEGUIDE STRUCTURE

(71) Applicant: Robert Bosch GmbH, Stuttgart (DE)

(72) Inventors: Alexander Fischer, Untergruppenbach (DE); Andreas Kugler, Alfdorf (DE); Armin Himmelstoss, Weissach Im Tal (DE); Corinne Grevent, Ostfildern (DE); Isabel Zander, Stuttgart (DE); Torsten Maenz, Jena (DE); Christian Silber, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 39 days.

(21) Appl. No.: 17/370,821

(22) Filed: Jul. 8, 2021

(65) Prior Publication Data

US 2022/0029281 A1  Jan. 27, 2022

(30) Foreign Application Priority Data

Jul. 23, 2020 (DE) .......................... 102020209307.5

(51) Int. Cl.
| | | |
|---|---|---|
| *H01Q 1/42* | (2006.01) | |
| *H05K 1/02* | (2006.01) | |
| *G01S 7/02* | (2006.01) | |
| *H01P 3/08* | (2006.01) | |
| *H01Q 13/00* | (2006.01) | |

(52) U.S. Cl.
CPC .............. *H01Q 1/42* (2013.01); *G01S 7/027* (2021.05); *H01P 3/081* (2013.01); *H05K 1/0243* (2013.01); *H01Q 13/00* (2013.01); *H05K 2201/10151* (2013.01)

(58) Field of Classification Search
CPC ........ H01Q 1/42; H01Q 1/2283; H01Q 1/405; H01Q 1/422; H01Q 13/10; H01Q 21/0006; H01Q 21/06; H01Q 23/00
See application file for complete search history.

(56) References Cited

U.S. PATENT DOCUMENTS

| | | | |
|---|---|---|---|
| 2014/0183710 A1* | 7/2014 | Laidig .................... | H01Q 23/00 257/664 |
| 2020/0021002 A1* | 1/2020 | Wojnowski .......... | H01Q 1/2283 |

FOREIGN PATENT DOCUMENTS

| | | | | |
|---|---|---|---|---|
| CN | 101896947 A | * | 11/2010 | ....... G06K 19/07749 |
| CN | 106206473 B | * | 6/2019 | ............. H01L 21/56 |
| DE | 102014208389 A1 | | 11/2015 | |
| DE | 102016224936 A1 | * | 6/2018 | ............... G01S 7/02 |

* cited by examiner

*Primary Examiner* — Hoang V Nguyen
(74) *Attorney, Agent, or Firm* — Norton Rose Fulbright US LLP; Gerard Messina

(57) ABSTRACT

A radar sensor. The radar sensor includes a high-frequency component situated on a circuit board and a waveguide structure, which is connected via a coupling structure to the high-frequency component. The waveguide structure is formed in a mold, which is injection molded to a part of the circuit board supporting the high-frequency component.

14 Claims, 7 Drawing Sheets

RADAR SENSOR INCLUDING WAVEGUIDE STRUCTURE

CROSS REFERENCE

The present application claims the benefit under 35 U.S.C. § 119 of German Patent Application No. DE 102020209307.5 filed on Jul. 23, 2020, which is expressly incorporated herein by reference in its entirety.

FIELD

The present invention relates to a radar sensor including a high-frequency component situated on a circuit board and a waveguide structure, which is connected via a coupling structure to the high-frequency component.

BACKGROUND INFORMATION

A radar sensor of this type is described in German Patent Application No. DE 10 2014 208 389 A1, in which the waveguide structure is an array of waveguide antennas.

SUMMARY

An object of the present invention is to provide a radar sensor which may be produced easily and with low manufacturing tolerances and is robust with respect to environmental influences.

This object may be achieved according to an example embodiment of the present invention in that the waveguide structure is formed in a mold, which is injection molded on a part of the circuit board supporting the high-frequency component.

In accordance with an example embodiment of the present invention, during the injection molding of the mold at the circuit board, by precisely aligning the circuit board with the tool used to form the mold, it is possible for the waveguide structure to be positioned and molded with narrow dimension tolerances in relation to the high-frequency component. At the same time, the use of additional fastening means is avoided by the integrally joined connection between the mold and the circuit board, which could result in later warping in the product. The occurrence of joints susceptible to corrosion between the mold and the circuit board is also avoided.

Advantageous refinements and embodiments of the present invention are disclosed herein.

In one specific example embodiment of the present invention, the high-frequency component or possibly also an arrangement including multiple high-frequency components is situated on the same side of the circuit board as the waveguide structure, and the high-frequency component or components are also extrusion coated using the material of the mold. However, specific embodiments are also conceivable in which the high-frequency component and the waveguide structure are located on opposite sides of the circuit board and the coupling structure includes a via passing through the circuit board. It is also conceivable that the circuit board is extrusion coated on both sides using the material of the mold. In this case, waveguide structures may be located on both sides of the circuit board.

The waveguide structure may form a waveguide antenna or an array of waveguide antennas and/or a distributor network which connects the antennas with respect to signaling to the high-frequency components. The waveguide structure may also include multiple layers of waveguides. In this case, the various layers may be manufactured in successive steps during the injection molding.

The mold may be formed by an electrically nonconductive material, for example a thermoplastic or thermosetting plastic, in which only the walls of the waveguides include an electrically conductive coating. In another specific embodiment, the mold as a whole may be made of an electrically conductive material, for example, a plastic including a certain content of electrically conductive particles which make the material electrically conductive as a whole. The material proportion and the grain size of the conductive particles are selected in such a way that sufficient conductivity is achieved even in consideration of the skin effect.

In one specific example embodiment of the present invention, the waveguide structure includes cavities which are open toward an outer surface of the mold. These cavities are then closed by a cover, which includes an electrically conductive layer at least on the side facing toward the mold. In the case of waveguide antennas, the cover may include suitably dimensioned and shaped openings for the emission and the reception of the radar signals.

The cover may be made of sheet metal as a whole or of a plastic which is metallized at least on one side. In the latter case, the cover may be a further mold into which a radome is integrated and/or which includes a relief for suppressing undesirable microwave reflections.

These features may also be advantageous independently of the features disclosed herein. Therefore, a radar sensor is also provided including a waveguide antenna, whose waveguides are formed by cavities formed in a main body, which are open toward an outer surface of the main body, and including a cover, which entirely or partially closes the cavities using an electrically conductive layer, the cover being formed by a mold into which a radome is integrated and/or whose outer surface includes a relief.

Alternatively or additionally, a heater for the radome or at least a plug connector for the connection of an external radome heater may be integrated into this mold.

The outer surface of the mold, in which the waveguide structure is formed, may also include a relief, so that, for example, a multilevel antenna array or a conformal antenna array is formed (i.e., the emission surfaces of the antenna elements lie in levels inclined in relation to one another or are part of a curved surface). If this relief of the outer surface is free of undercuts, the cover may be an integral mold having a surface complementary to the relief.

Exemplary embodiments are explained in greater detail hereinafter on the basis of the figures.

DETAILED DESCRIPTION OF EXAMPLE EMBODIMENTS

Figure 1:
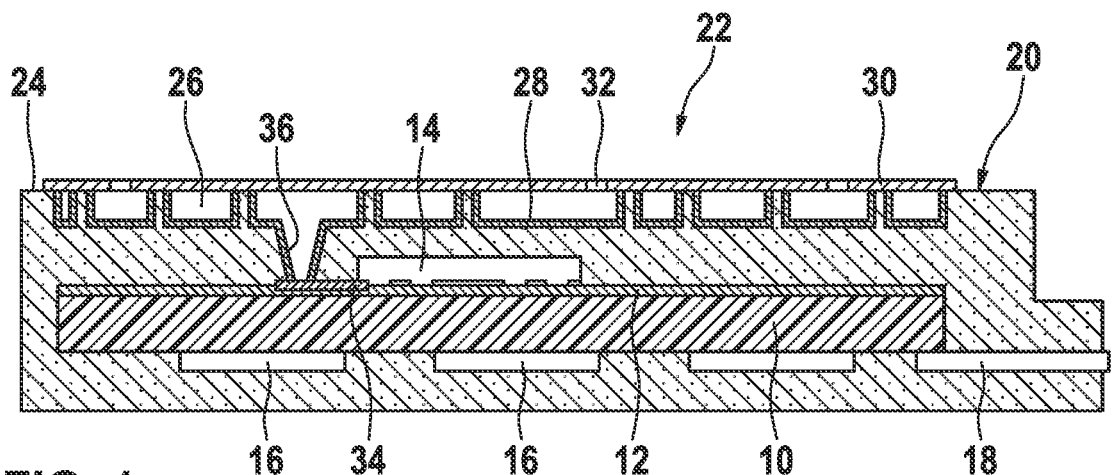
FIG. 1 shows a schematic section through a radar sensor according to an example embodiment of the present invention.

The radar sensor shown in section in FIG. 1 includes a circuit board 10, which includes a high-frequency capable carrier substrate 12 on the upper side and is equipped with a high-frequency component 14. High-frequency component 14 may be, for example, an MMIC package (monolithic microwave integrated circuit including plastic housing). On the lower side, circuit board 10 is equipped in a known way with further electronic components 16 (e.g., ICs, SMDs (surface mounted devices)) and with a contact unit 18 for a connection plug. Entire circuit board 10 including the components arranged thereon (with exception of a part of contact unit 18) is extrusion coated using a mold 20 made of an electrically nonconductive plastic, preferably using a thermosetting plastic, optionally also using a thermoplastic. A waveguide structure 22 is formed in the upper side of mold 20, which includes a number of cavities 26 open toward outer surface 24 of the mold, whose walls were made conductive by a metallization 28. A cover 30, which covers all cavities 26 and is an electrical contact with metallizations 28 thereof, is attached to outer surface 24 with the aid of any known joining technologies such as welding or adhesive bonding, so that cavities 26 may act as waveguides. In the area of some of cavities 26, cover 30 includes openings 32, through which microwaves may be emitted and/or received, so that the associated cavities have the function of waveguide antennas. The remaining waveguides of waveguide structure 22 form a distributor network, via which the radar signals generated in high-frequency component 14 are transmitted to the waveguide antennas and/or the radar signals received by the waveguide antennas are transmitted to high-frequency component 14. For the signaling coupling of high-frequency component 14 to waveguide structure 22, a high-frequency line 34, for example, a microstrip line, is formed on carrier substrate 12, which couples via a coupling structure 36 to one of the waveguides. It is obvious that the radar sensor may include multiple high-frequency components 14 on the same circuit board 10, which are each coupled via an associated distributor network to waveguide antennas.

During the manufacturing of the radar sensor, initially circuit board 10 is equipped with the high-frequency components and the other electronic components and contact unit 18 and then extrusion coated using mold 20, a precise alignment of the molding tool in relation to the circuit board being ensured by alignment marks (not shown). After the demolding, the walls of cavities 26 (with the exception of the free end of coupling structure 36) are provided with metallization 28, and finally the cavities are closed by cover 30.

In the example shown, cover 30 is simply formed by a metal plate. However, in other specific embodiments, the cover may also be a metallized plastic plate or a metallized mold made of plastic.

Figure 2:
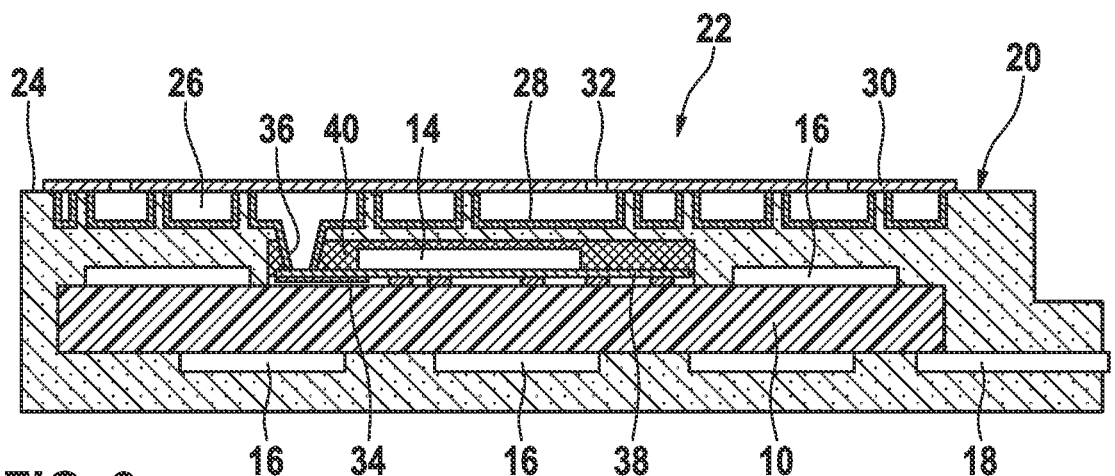
FIGS. 2 through 4 show sectional views of different variants of another specific example embodiment of the present invention.

FIG. 2 shows a modified exemplary embodiment in which high-frequency component 14 is an MMIC in the form of an unpackaged semiconductor chip (bare chip), which is situated on a redistribution level 38 and is extrusion coated using a packaging 40, which also forms a part of coupling structure 36. High-frequency line 34 for the coupling to coupling structure 36 is formed in this case on redistribution level 38, so that a costly high-frequency capable substrate (substrate 12 in FIG. 1) for circuit board 10 may be omitted. This also has the advantage that electronic (low-frequency) components 16 may also be situated together with high-frequency component 14 on the upper side of the circuit board. Packaging 40 including the semiconductor chip and the redistribution level forms a so-called first-order package, which may be implemented in different ways, for example, by an eWLB (embedded wafer level ball grid array) or as a flip chip on an interposer. Since in such a first-order package, mold 20 does not come into contact with the first-order semiconductor material of mold 20 which does not come into contact with the semiconductor material of the high-frequency component, the material used for mold 20 does not have to be ion-free.

Figure 3:
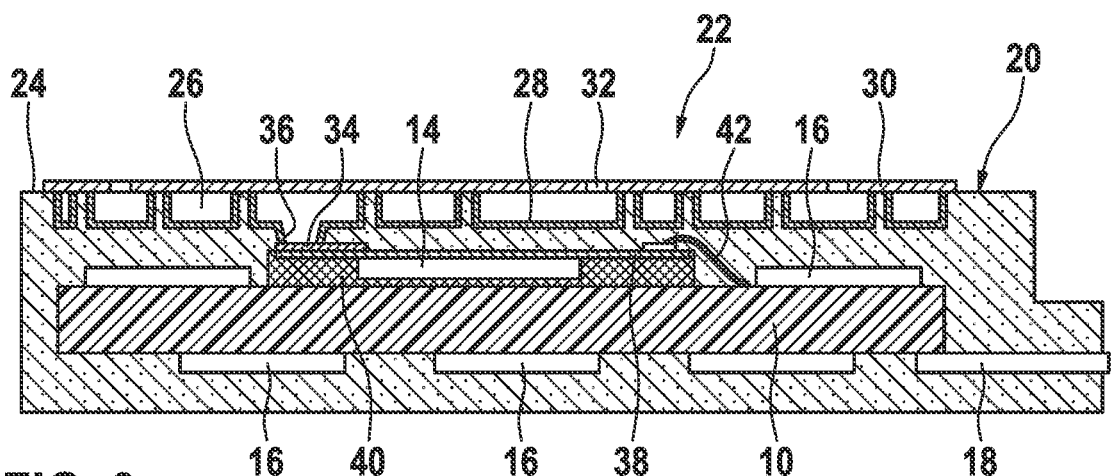
Figure 4:
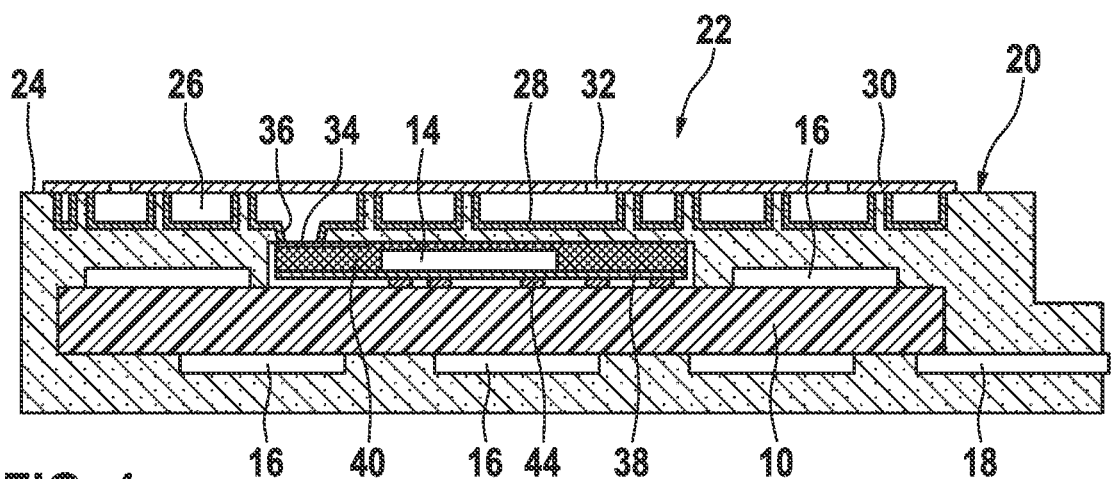

FIGS. 3 and 4 show possible modifications of the exemplary embodiment according to FIG. 2. Redistribution level 38 and microwave (high-frequency) line 34 are formed on the upper side of the package in FIG. 3, and the package is contacted with the aid of bond wires 42. In FIG. 4, redistribution level 38 is located on the lower side of the package and the contacting is carried out with the aid of solder balls 44 (for example in the form of a BGA (ball grid array)). High-frequency line 34 is located on the upper side of the package and is formed by a so-called pad-on-package antenna. Alternatively, the package could also be an eWLB or CSP (chip size package) including flip chip on interposer.

In still another specific embodiment, high-frequency component 14 is configured as an AoP package (antenna on package). Various examples of such a package are shown in FIGS. 5 through 7.

Figure 5:
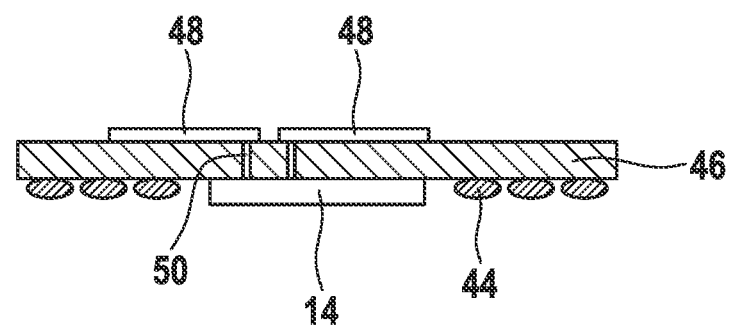
FIGS. 5 through 7 show schematic sectional views of high-frequency components which are usable in radar sensors according to the present invention.

In FIG. 5, high-frequency component 14 formed by a MMIC (bare chip) is attached to the lower side of a multilayer interposer 46, which supports multiple antennas 48 on its upper side, which are used for coupling to waveguide structure 22 and are connected to the semiconductor chip via metallized lead-throughs 50 referred to as vias.

Figure 6:
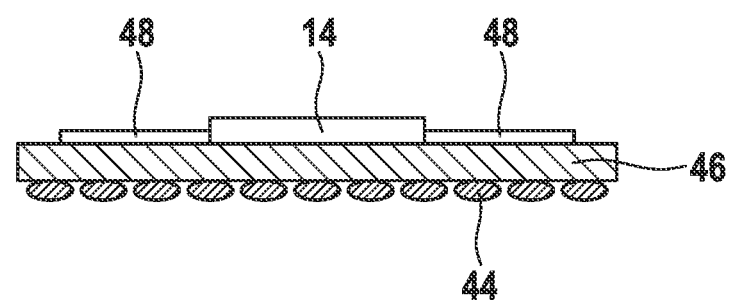

In FIG. 6, antennas 48 and the MMIC are located on the upper side of interposer 46.

Figure 7:
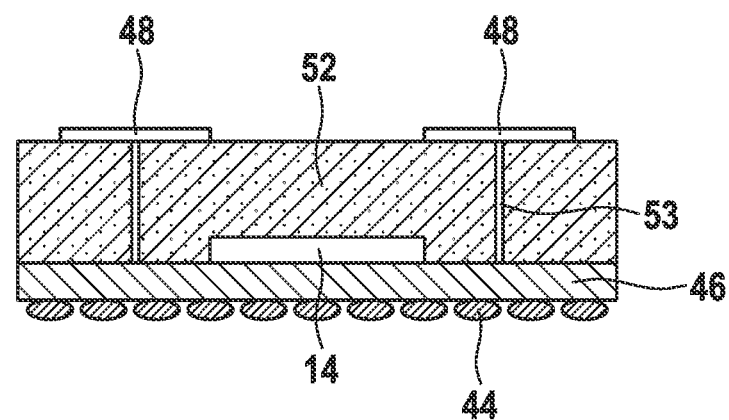

In FIG. 7, the MMIC situated on interposer 46 has a packaging 52 molded around it, on whose upper side antennas 48 are located. The attachment of the antennas to high-frequency component 14 takes place in this case with the aid of vias 53, so-called through mold vias, which pass through packaging 52, and with the aid of interposer 46.

In each case, the contacting of the package is carried out with the aid of solder balls 44.

Figure 8:
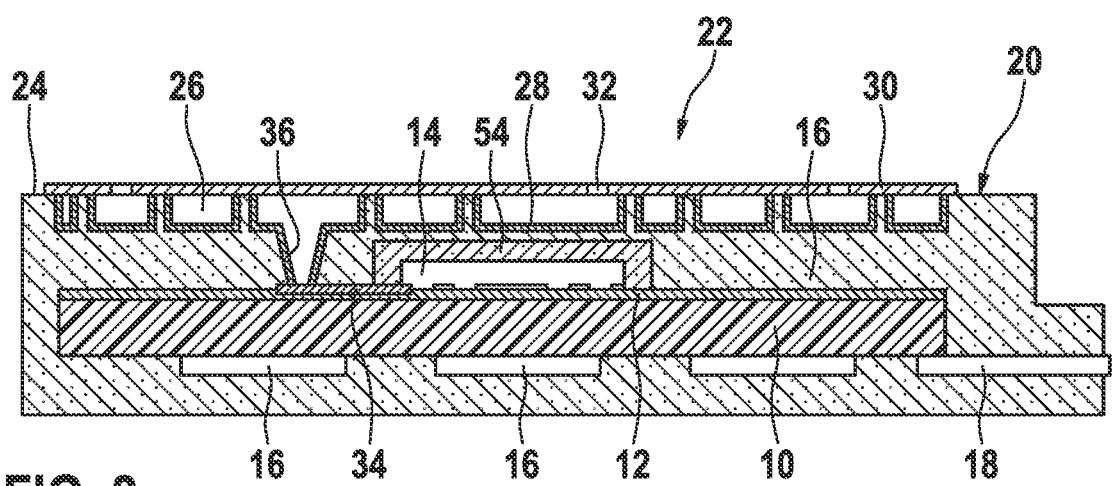
FIGS. 8 through 11 show sectional views of radar sensors according to further exemplary embodiments of the present invention.

FIG. 8 shows an exemplary embodiment which differs from the exemplary embodiment according to FIG. 1 in that the extrusion coating of high-frequency component 14 using plastic takes place in two steps. In a first step, high-frequency component 14 mounted on circuit board 10 is extrusion coated using a packaging 54, and in a second step, mold 20 is then injection molded, which accommodates circuit board 10 and packaging 54 and forms waveguide structure 22. This manufacturing method including two injection molding steps may also be applied similarly in specific embodiments in which the high-frequency component is a flip chip MMIC or an MMIC contacted by wire bonding. In the latter case, the bond wires are then embedded in packaging 54.

Figure 9:
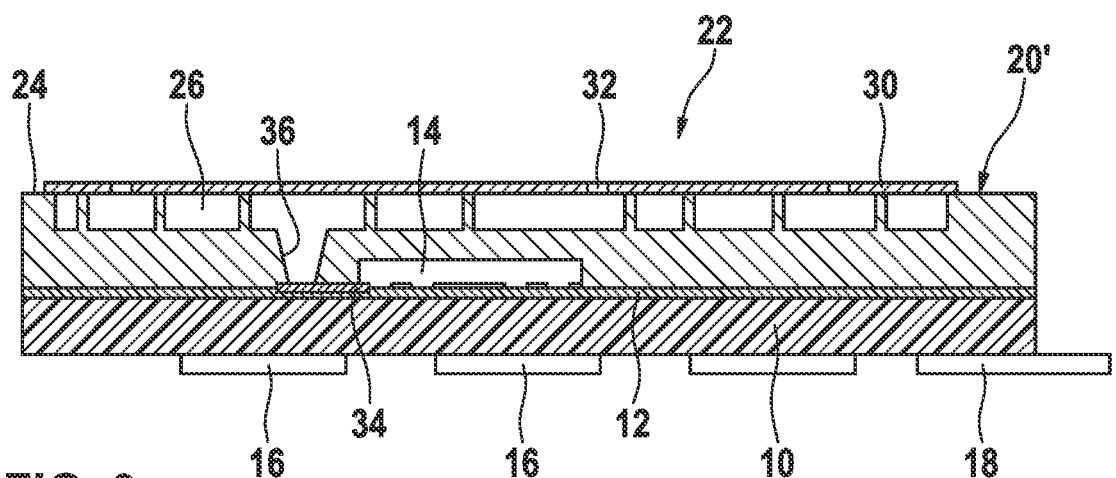

FIG. 9 shows an exemplary embodiment which differs from the exemplary embodiment according to FIG. 1 in that high-frequency component 14 (for example a bare chip MMIC) is extrusion coated using a mold 20' made of an electrically conductive molding material, for example, using an electrically conductive ion-free epoxy thermoset plastic. Metallization 28 on the walls of waveguide structure 22 may then be omitted.

Figure 10:
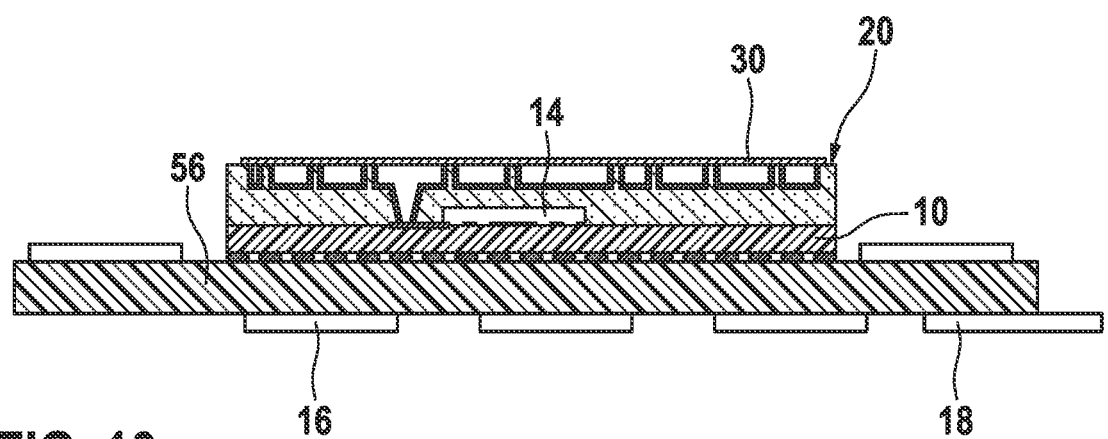

FIG. 10 shows an exemplary embodiment in which circuit board 10 including high-frequency component 14 or multiple high-frequency components and mold 20 including cover 30 form a module, which only forms the high-frequency part of the radar sensor, while the remaining (low-frequency) components 16 are situated on a main circuit board 56, which is then equipped with the high-frequency module.

Figure 11:
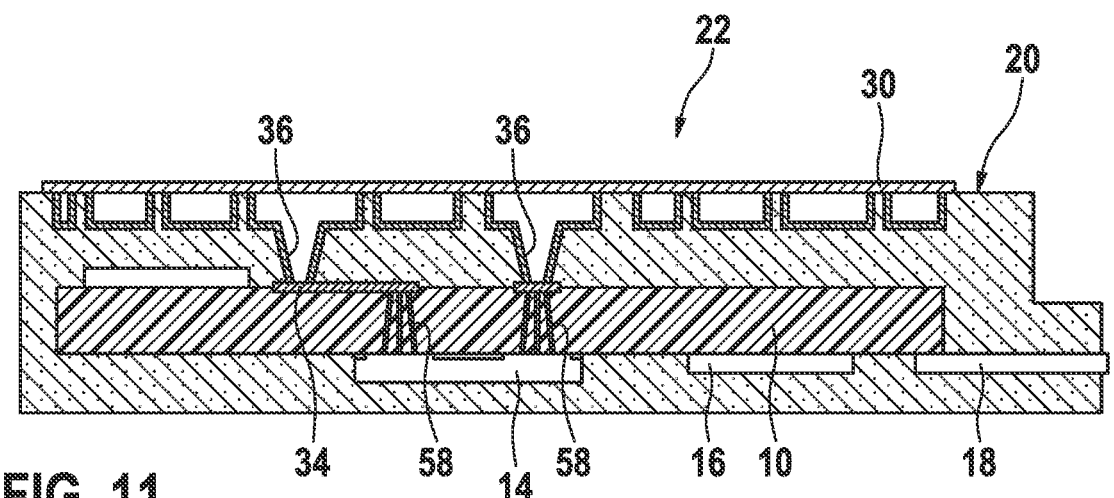

FIG. 11 shows an exemplary embodiment in which high-frequency component 14, for example an MMIC in package, is situated on the lower side of circuit board 10. The attachment to waveguide structure 22 takes place in this case with the aid of coaxial impedance transformers 58, which lead through the circuit board to its upper surface and are then connected either indirectly with the aid of high-frequency line 34 formed on the upper side of the circuit board or directly with the aid of coupling structure 36 to waveguide structure 22.

Figure 12:
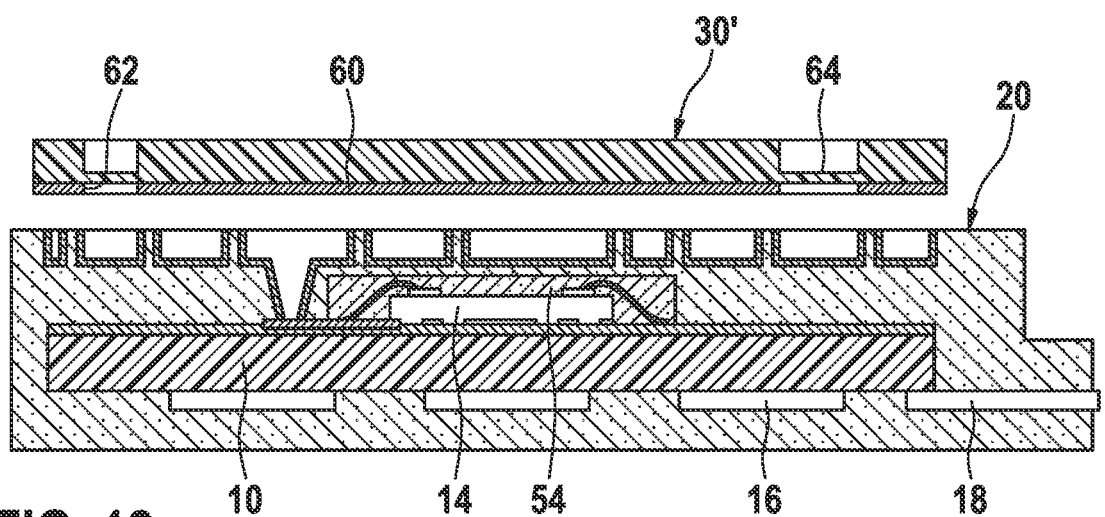
FIG. 12 shows an exploded sectional view of a radar sensor including a waveguide structure closed by a cover, in accordance with an example embodiment of the present invention.

FIG. 12 shows a radar sensor, in which high-frequency component 14 is a bonded MMIC on the upper side of the circuit board, which is extrusion coated using packaging 54 similarly as in FIG. 8, which is then in turn embedded in mold 20. A cover 30', which replaces cover 30 formed by a sheet-metal plate in the above-described specific embodiments, is shown separately from mold 20 here. Cover 30' is a plate-shaped mold made of plastic, which has a metallization 60 on the lower side, which is interrupted at some points by windows 62 to form emission openings for the microwaves. However, the plastic body of the cover is not penetrated at these openings 62, but only thinned to a relatively thin diaphragm 64, which closes relevant windows 62 to the outside. In this way, cover 30' also forms a radome, thus a cover which lets the microwave radiation pass practically undamped, but prevents the penetration of dirt or corrosive media into the waveguide structure.

Figure 13:
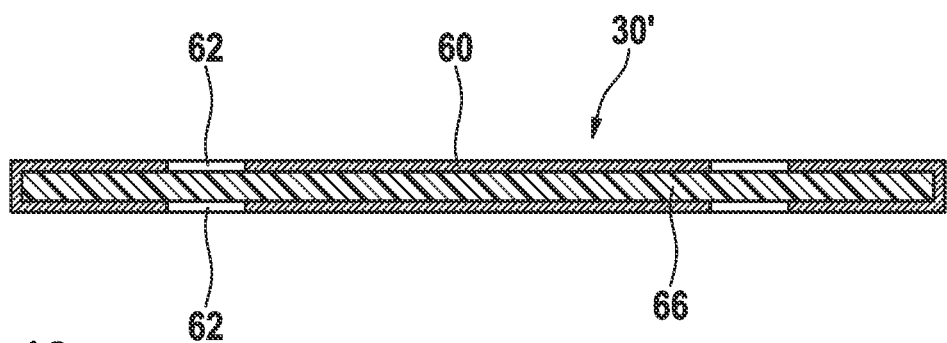
FIGS. 13 through 16 show sectional views of different specific embodiments of the cover.

Modifications of cover 30' are shown in FIGS. 13 through 16. In FIG. 13, the cover includes a plate-shaped core 66 made of plastic, which includes metallization 60 on its entire outer surface. The emission openings for the waveguide antennas are formed by windows 62 aligned with one another in the metallization on the opposing surfaces of the cover.

Figure 14:
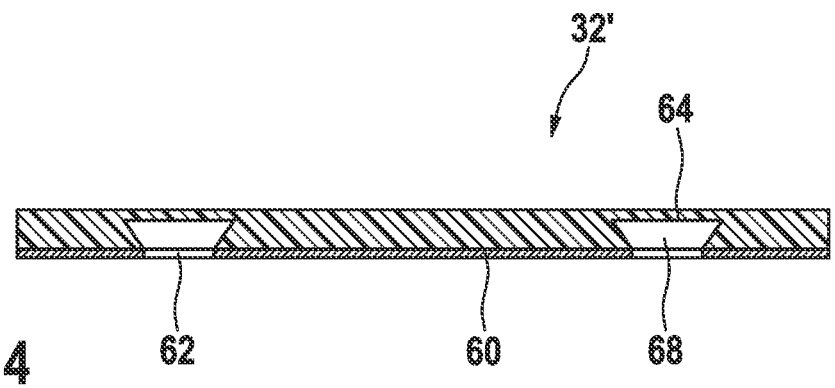

FIG. 14 shows a further variant with integrated radome. Diaphragms 64 are located here, however, on the upper side of the plastic plate and cover breakthroughs 68, which taper in cross section to windows 62 in metallization 60, which is only formed on the lower side.

Figure 15:
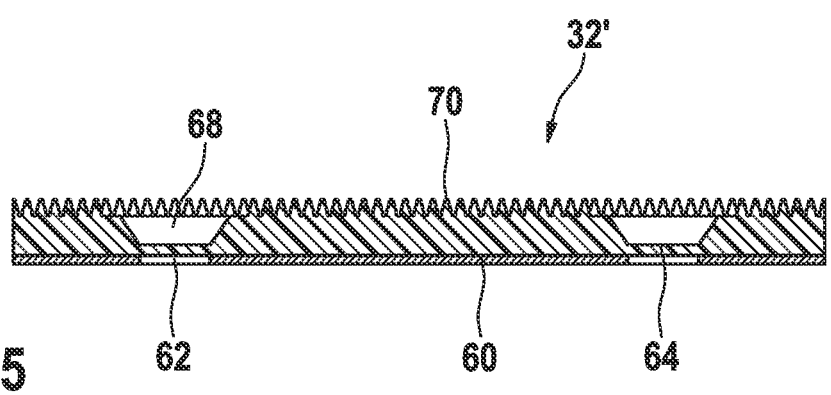

In FIG. 15, breakthroughs 68 are open on the upper side (outer side) and taper toward diaphragms 64, which are formed here on the lower side of the plastic block (plastic mold) and cover windows 62 in the metallization. The entire outer surface of the cover with the exception of the emission openings forms a relief 70 in this specific embodiment, which forms an absorber structure 70 in the form of a grid made of conical projections, which are to suppress undesirable reflections on the surface of the radome.

Figure 16:
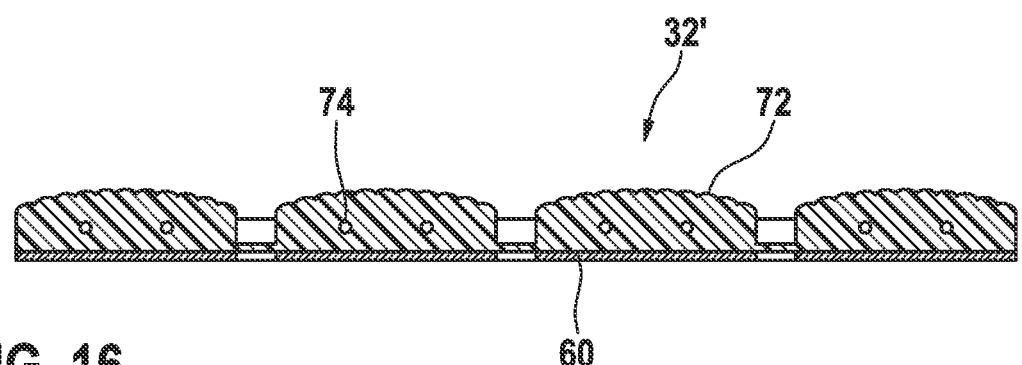

Finally, FIG. 16 shows a variant of cover 32' including integrated radome, which differs from the variant according to FIG. 15 above all in that the outer surface of the cover forms a relief 72 having a spacious curved surface. This measure is also used to suppress undesirable reflections or deflect or scatter them in harmless directions. Optionally, relief 72 on the curved surface may also form even finer absorber structures.

A further special feature of the cover according to FIG. 16 is that heating wires are embedded in the plastic body, which form a heater 74 for the radome. The formation of a crust made of snow or ice on the radome and thus blinding of the radar sensor may be counteracted by such an integrated heater.

Figure 17:
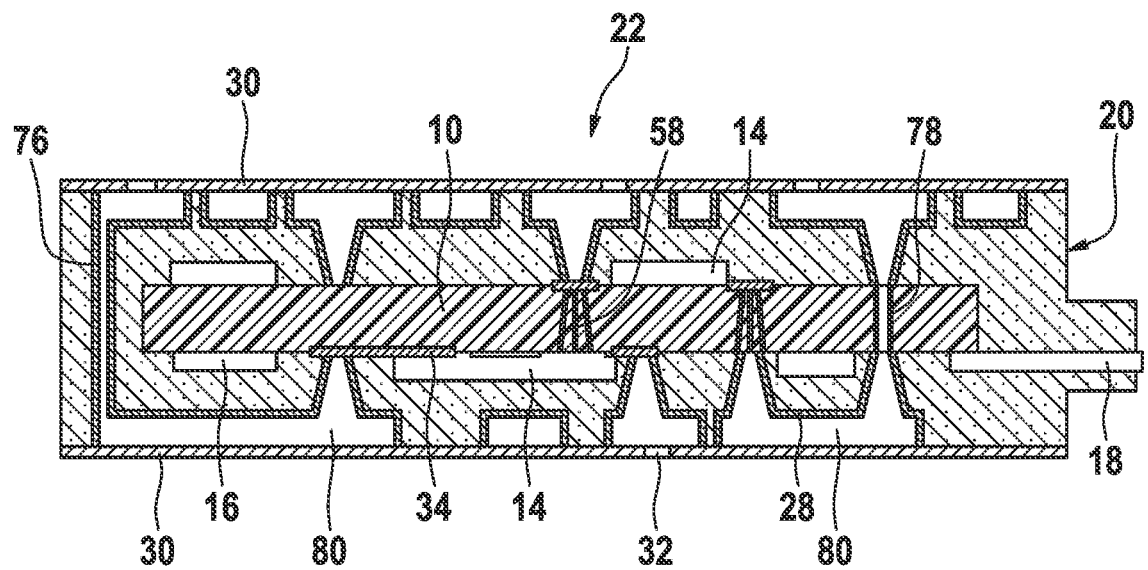
FIGS. 17 and 18 show sectional views of radar sensors according to further exemplary embodiments of the present invention.
Figure 18:
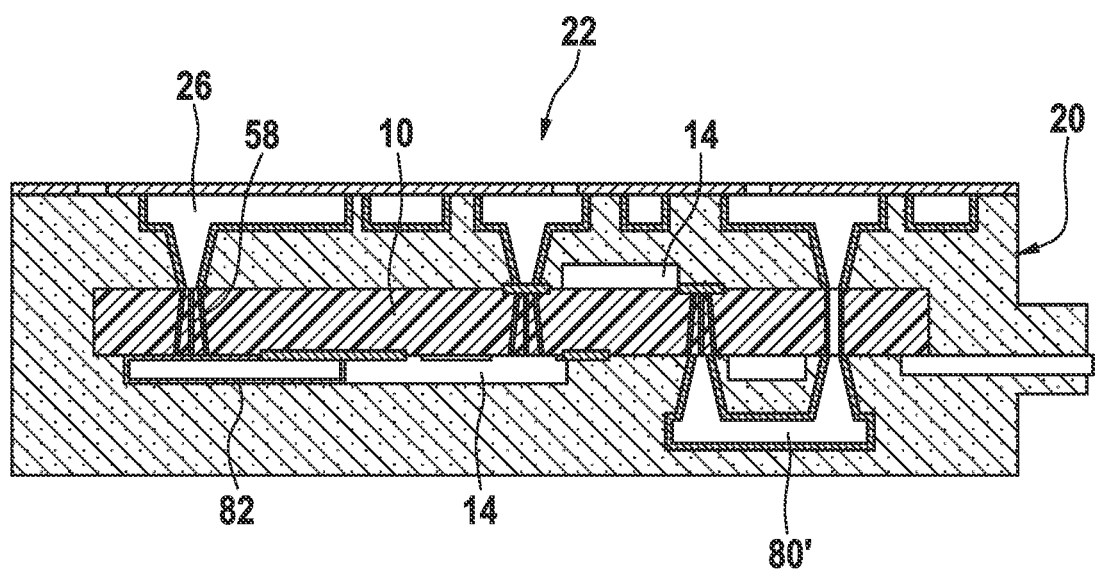

FIGS. 17 and 18 show exemplary embodiments in which parts of waveguide structures 22 are formed on opposite sides of circuit board 10 in mold 20. Both sides of mold 20 may thus be used for more complex distributor networks. Waveguide antennas may optionally also be formed on both sides of the mold, so that radar radiation may be emitted in opposite directions.

Connections between the parts of waveguide structure 22 on the opposite sides of circuit board 10 may be formed in different ways, for example, by connection waveguides 76 which bypass circuit board 10, or with the aid of vias 78 through the circuit board.

In the examples shown here, circuit board 10 is equipped on both sides with high-frequency components 14, which are connected to the distributor networks via coaxial impedance transformers 58 and/or via planar high-frequency lines 34.

In FIG. 17, the distributor networks also include distributor bridges 80, using which some of electronic components 16 may be bridged. The cavities which form distributor bridges 80 are produced during the injection molding of mold 20 and are provided like the other parts of the waveguide structure with metallization 28 and then closed using covers 30 on both sides of mold 20.

The exemplary embodiment shown in FIG. 18 includes waveguide distributor structures 80', 82, which are not manufactured during the injection molding of mold 20, but are formed as separate waveguide elements, with which circuit board 10 is equipped and which are subsequently extrusion coated using the material of mold 20 together with high-frequency components 14. Distributor structure 80' is a bridge distributor similar to bridge distributor 80 in FIG. 17, while distributor structure 82 is a distributor chamber directly abutting circuit board 10, which is coupled in this example by a coaxial impedance transformer 58 to one of the waveguides on the upper side of the circuit board.

Figure 19:
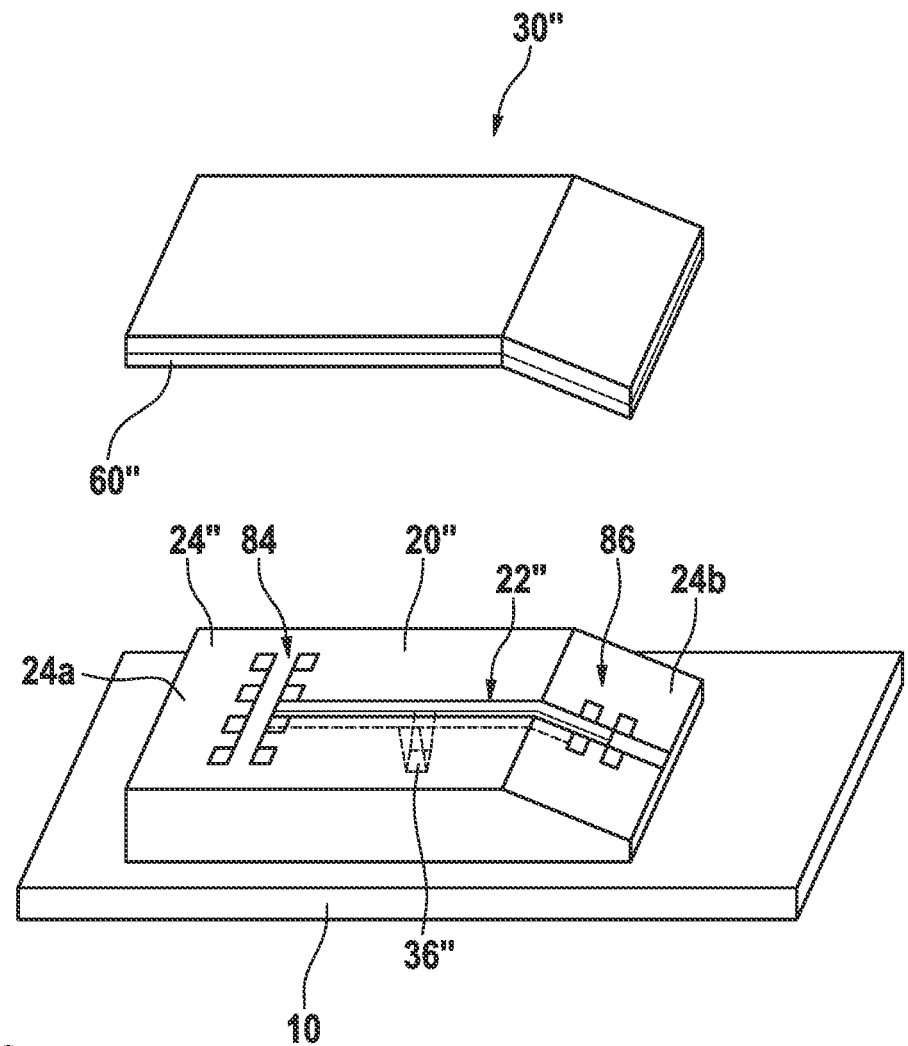
FIG. 19 shows a perspective exploded view of a radar sensor according to a further exemplary embodiment of the present invention.

While the radar sensor according to FIG. 17 includes waveguide antennas in two levels parallel to one another (on opposite sides of circuit board 10), specific embodiments are also possible in which waveguide antennas are formed in multiple nonparallel levels and form a multilevel antenna. A simple example is shown in FIG. 19. A mold 20", which completely encloses the high-frequency component (not visible here) and forms a waveguide structure 22", is injection molded on circuit board 10 on one side. This waveguide structure forms a distributor network, which is coupled via a coupling structure 36" to the high-frequency component and leads to two partial arrays 84, 86 of waveguide antennas. The waveguide antennas and the distributor structure are open to outer surface 24" of mold 20'. This outer surface 24" includes two nonparallel partial surfaces 24a, 24b, which adjoin one another to form an angle and each contain one of partial arrays 84, 86. Waveguide structure 22" is completed by a cover 30" injection molded in one piece from plastic, which has a shape complementary to outer surface 24" and includes a metallization 60″ on the lower side, which only leaves out the emission openings of the waveguide antennas.

What is claimed is:

1. A radar sensor, comprising:
   a high-frequency component situated on a circuit board; and
   a waveguide structure which is connected via a coupling structure to the high-frequency component;
   wherein the waveguide structure is formed in a mold which is injection molded to a part of the circuit board supporting the high-frequency component, and
   wherein the waveguide structure forms at least one waveguide antenna.

2. The radar sensor as recited in claim 1, wherein the high-frequency component is extrusion coated using material of the mold.

3. The radar sensor as recited in claim 2, wherein the circuit board is extrusion coated as a whole with the mold, with the exception of plug connections.

4. The radar sensor as recited in claim 1, wherein the waveguide structure forms a distributor structure for connecting the high-frequency component to radar antennas.

5. The radar sensor as recited in claim 1, wherein the high-frequency component is extrusion coated using a material which forms a packaging of the high-frequency component, and the packaging is extrusion coated using material of the mold.

6. A radar sensor, comprising:
   a high-frequency component situated on a circuit board; and
   a waveguide structure which is connected via a coupling structure to the high-frequency component;
   wherein the waveguide structure is formed in a mold which is injection molded to a part of the circuit board supporting the high-frequency component, and
   wherein the mold is made of electrically conductive material.

7. A radar sensor, comprising:
   a high-frequency component situated on a circuit board; and
   a waveguide structure which is connected via a coupling structure to the high-frequency component;
   wherein the waveguide structure is formed in a mold which is injection molded to a part of the circuit board supporting the high-frequency component, and
   wherein the waveguide structure includes cavities, which are open toward an outer surface of the mold and whose inner walls include a metallization, and the cavities are closed by a cover covering the outer surface, the cover including a metal layer at least on a side facing toward the mold.

8. The radar sensor as recited in claim 7, wherein an outer surface of the mold includes nonparallel partial surfaces, which form an undercut-free relief, and the cover includes a molded part manufactured in one piece, which has a metallic surface complementary to the outer surface.

9. The radar sensor as recited in claim 7, wherein the cover is a mold made of plastic, which includes a metallization on at least one side.

10. The radar sensor as recited in claim 9, wherein the mold of the cover forms a radome of the radar sensor.

11. The radar sensor as recited in claim 10, wherein at least parts of a radome heater are integrated into the mold of the cover.

12. The radar sensor as recited in claim 9, wherein the mold of the cover includes a relief on the non-metallized side.

13. The radar sensor as recited in claim 12, wherein the relief is an absorber structure.

14. The radar sensor as recited in claim 12, wherein the relief includes a surface which is curved overall, with or without absorber structures.

* * * * *